United States Patent
Hayashi et al.

(10) Patent No.: US 7,670,433 B2
(45) Date of Patent: Mar. 2, 2010

(54) VACUUM DEPOSITION APPARATUS OF THE WINDING TYPE

(75) Inventors: Nobuhiro Hayashi, Chigasaki (JP); Shin Yokoi, Chigasaki (JP); Isao Tada, Chigasaki (JP); Atsushi Nakatsuka, Chigasaki (JP)

(73) Assignee: Ulvac, Inc., Kanagawa (JP)

( * ) Notice: Subject to any disclaimer, the term of this patent is extended or adjusted under 35 U.S.C. 154(b) by 323 days.

(21) Appl. No.: 11/630,761

(22) PCT Filed: Feb. 14, 2006

(86) PCT No.: PCT/JP2006/302550

§ 371 (c)(1),
(2), (4) Date: Dec. 22, 2006

(87) PCT Pub. No.: WO2006/088024

PCT Pub. Date: Aug. 24, 2006

(65) Prior Publication Data

US 2007/0259105 A1 Nov. 8, 2007

(30) Foreign Application Priority Data

Feb. 16, 2005 (JP) .............................. 2005-039271

(51) Int. Cl.
*C23C 16/00* (2006.01)
*C23C 14/00* (2006.01)
(52) U.S. Cl. .................................. 118/718; 204/298.24
(58) Field of Classification Search .................. 118/718
See application file for complete search history.

(56) References Cited

U.S. PATENT DOCUMENTS 5,258,074 A * 11/1993 Okuda et al. ................. 118/718
6,060,836 A 5/2000 Maeno et al.

FOREIGN PATENT DOCUMENTS

| JP | 63-213118 A | 9/1988 |
| JP | 02-239428 A | 9/1990 |
| JP | 07-118835 A | 5/1995 |
| JP | 11279764 A * | 10/1999 |
| JP | 2000-017440 A | 1/2000 |
| JP | 2002358633 A * | 12/2002 |
| JP | 2003-301260 A | 10/2003 |

* cited by examiner

*Primary Examiner*—Karla Moore
(74) *Attorney, Agent, or Firm*—Carothers & Carothers

(57) ABSTRACT

The problem solved by this Invention is to provide a vacuum evaporation deposition method of the winding type and a vacuum evaporation deposition apparatus of the winding type which can form a metal film on a base film made of single layer plastic film without thermal deformation and with superior productivity. To solve the above problem, there are provided an electron beam irradiator 21 for irradiating an electron beam onto a film material 12 arranged between an unwinding roller 13 and a deposition source 16; an auxiliary roller 18 for guiding the film 12 in contact with the deposited metal layer and arranged between a can roller 14 and a winding roller 15; a DC bias power source 22 for applying a DC voltage between the auxiliary roller 18 and the can roller 14; electricity removing unit 23 for removing electricity from the film 12 and arranged between the can roller 14 and the winding roller 15. The electricity removing unit 23 is a plasma generating source of the DC dipolar discharge type wherein one of its electrodes is earthed.

5 Claims, 8 Drawing Sheets

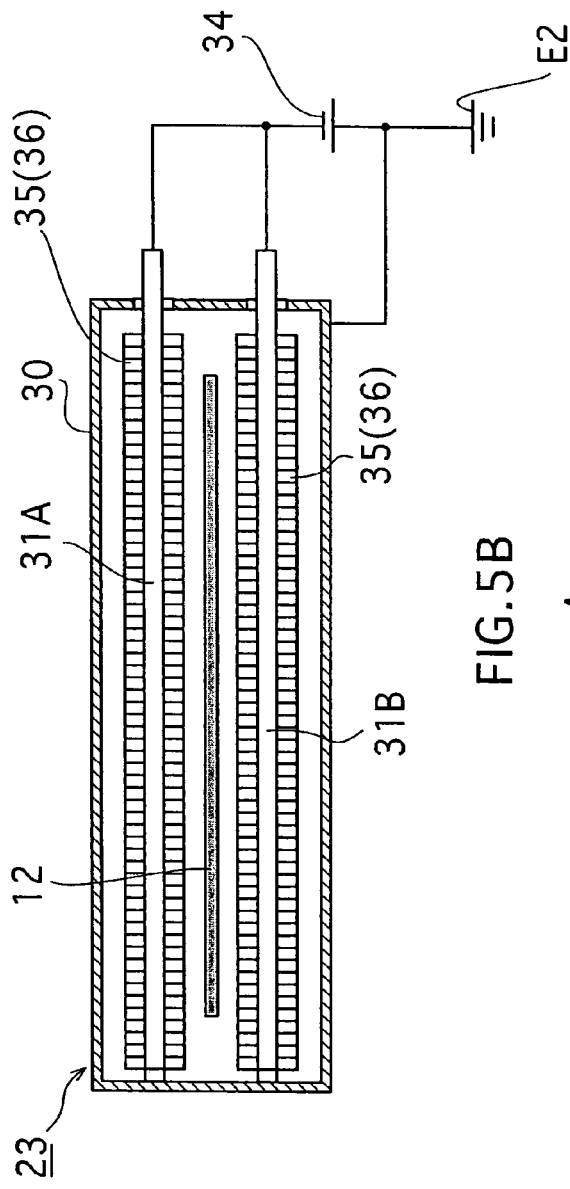
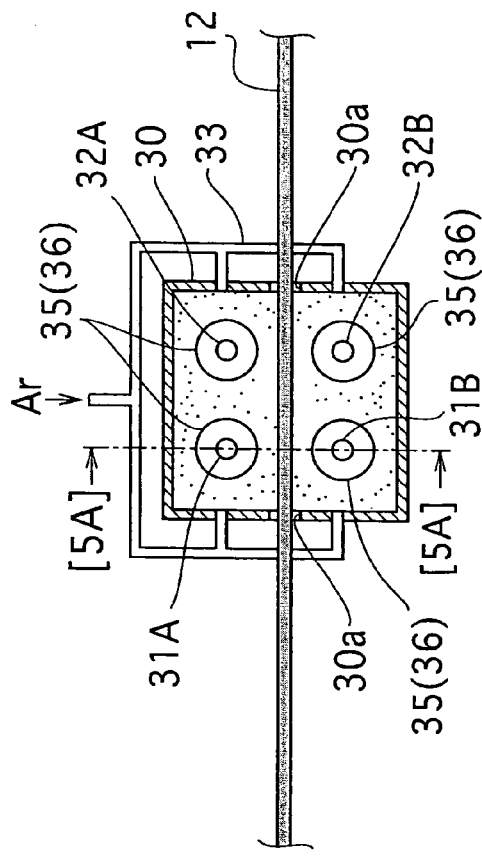
FIG.5A
FIG.5B

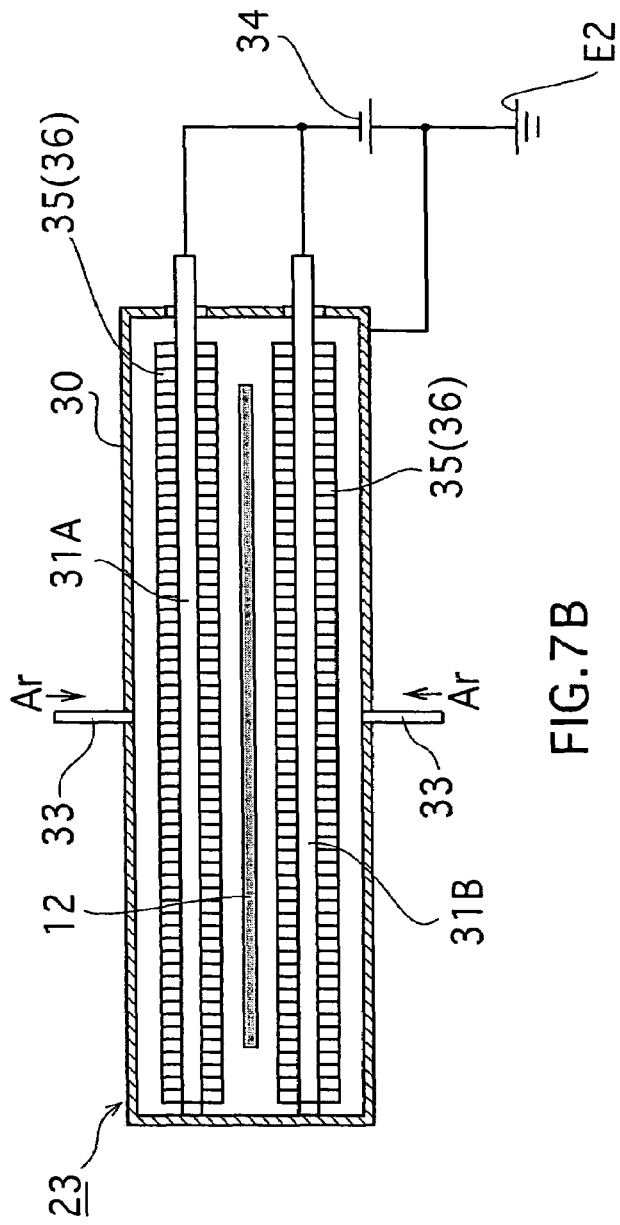
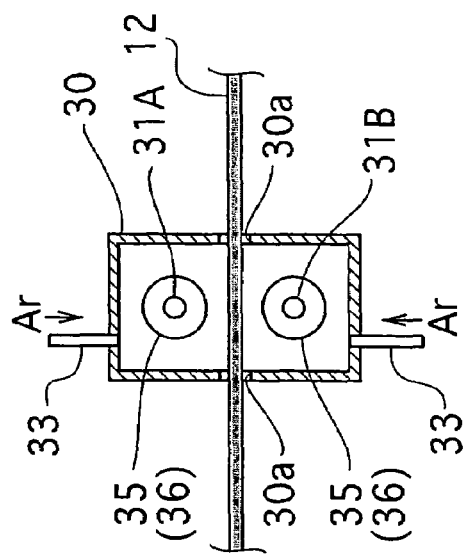

VACUUM DEPOSITION APPARATUS OF THE WINDING TYPE

TECHNICAL FIELD

This invention relates to a vacuum deposition apparatus of the winding type in which an insulating film is continuously fed through a reduced pressure atmosphere, and cooled by close contact with a cooling roller, and a metal layer is formed on the insulating film and the metal layer so formed insulating film is wound up on a winding roller.

BACKGROUND OF THE TECHNIQUE

In the prior art, such an evaporation deposition apparatus of the winding type is disclosed, in which a long film material is continuously fed from a unwinding roller, passing along in contact with a cooling can roller and wherein evaporation material from an evaporation source facing to the can roller is deposited on the film material, and the deposited film material is wound up on a winding roller. This is disclosed, for example, in patent literature 1 referenced hereinafter.

In the vacuum evaporation deposition apparatus of this kind, a film material is cooled in contact with the peripheral surface of a cooling can roller to prevent the film from thermally deforming, and a layer is formed on the cooled film material. Accordingly, it is an important problem to solve as to how the material film is closely contacted with the cooling can roller in the vacuum evaporation deposition apparatus.

An arrangement to obtain close contact between the film material and the cooling can roller is disclosed, for example, in the hereinafter referenced patent literature 2. FIG. 8 shows a schematic construction of a deposition apparatus of the winding type, described in the patent literature 2, in which the layer is deposited by the plasma CVD method.

Referring to FIG. 8, an unwinding roller 3 with a wound film 2 on which a metal layer is formed, a cooling can roller 4 and a winding roller 5 are arranged in a vacuum chamber under reduced pressure. A reaction gas supply source 6 is arranged under the cooling can roller 4. A primary conductive thin layer is formed on an insulating film, providing the film 2 with a metal layer. A reaction gas from a reaction gas supply source 6 reacts on the primary conductive thin layer to form the layer. An insulating layer is formed on the surface of the can roller 4 which is made of metal. A predetermined negative potential is applied to the roller body.

An electron beam radiator 7 is arranged between the unwinding roller 3 and the can roller 4, in the deposition apparatus (plasma CVD) of the winding type as shown in FIG. 8. A guide roller 8 is arranged between the electron beam radiator 7 and the can roller 4 to connect the conductive layer of the film 2 to earth. Thus, the film 2 with the metal layer is charged with the electron beam onto the insulating layer surface thereof. The film 2 is closely contacted with the can roller 4 by the electrical attractive force between the can roller 4 and the film 2 with its metal layer.

Patent Document 1: JP7-118835A
Patent Document 2: JP2000-17440A
Patent Document 3: JP2003-301260A

DISCLOSURE OF INVENTION

Problem to be Solved by the Invention

However, only plastic film with a conductive layer, such as the film 2 with a metal layer is applicable in the prior art deposition apparatus (plasma CVD) as shown in FIG. 8. There is a problem in that the prior art apparatus is not suitable for metal layer deposition on a film material such as plastic.

In the prior art deposition apparatus (CVD) of the winding type, a bias potential applied to the cooling can roller can be effective for the film with a metal layer which is already formed thereon. However, when a metal layer is newly deposited, the bias potential cannot be applied to the film material before the metal layer is formed. When only a film material is charged before the metal layer is formed, electric charges are diffused onto the deposited metal layer during the metal deposition. In that case, an electrostatic attractive force is created between the can roller and the film material and therefore the contact force is deteriorated.

Accordingly, the charge method and the bias application method employed in the prior art deposition apparatus (plasma CVD) of the winding type are not suitable for metal layer deposition on film material such as plastic film, and a high contact force cannot be obtained between the cooling can roller and the metal layer. The film material is shrunk and deformed due to the deficiency of the cooling effect of the film material. The running speed of the film material cannot be gathered. Accordingly, the productivity cannot be improved.

When an electron beam is irradiated onto a film material in order to increase the close contact force between the can roller and the material film, some electric charges remain on the film material even after the layer forming operation. There is a problem in that the film is wrinkled on winding or manufacturing or assembling of film condensers and therefore the film cannot be suitably wound up.

This invention has been made in consideration of the above problems. It is an object of this invention to provide a vacuum deposition apparatus of the winding type in which thermal deformation of a film material such as plastic is suppressed, as a metal layer is formed at a high speed, and superior productivity is obtained. It is a further object to remove effectively the remaining electric charges on the film material.

SUMMARY OF THE INVENTION

The above-described object can be achieved by a vacuum deposition apparatus of the winding type which comprises: a charged particle irradiating means for irradiating charged particles onto a film material, arranged between an unwinding roller and deposition means; an auxiliary roller for guiding an insulating-film material in contact with the deposition metal layer, arranged between a cooling roller and a winding roller; voltage supplying means for supplying voltage between the cooling roller and the auxiliary roller; and electricity removing means for removing electricity from the film material, arranged between the winding roller and the cooling roller, the electricity removing means being a plasma generating source of the DC dipole discharging type, one of the electrodes being earthed.

Before forming the metal layer, film material electrified with irradiation of the charged particles is made to be in close contact to the cooling roller, to which a bias potential is applied by an electrostatic attractive force. On the other hand, after forming of the metal layer, part of charges on the film are dissipated with metal layer deposition. However, a potential is applied to the metal layer in contact with said auxiliary roller. Thus, an electrostatic attraction occurs between the metal layer and the cooling roller. Accordingly, also after the deposition of metal, an attraction force is maintained between the film and the cooling roller.

Further, after forming the metal layer, the charged particles are removed from the film by electricity removing means arranged between the cooling roller and the winding roller.

This electricity removing means is comprised of the plasma-generating source of the DC diode discharge type, of which one of electrodes is earthed. Accordingly, the DC voltage can be finely controlled on the standard of the earth potential. Electricity removal effect can thus be raised.

Thus, in this invention, a highly close contact force can be obtained between the film and the cooling roller, both before and after forming of the metal layer, and so the cooling efficiency of the film can be raised. Thermal deformation of the film can be prevented on the forming of the metal layer and the running speed of the film can be improved, and productivity can be improved. Further, since the electricity removing effect can be improved, winding or manufacturing or assembling of the film condensers can be smoothed.

EFFECT OF THE INVENTION

According to this invention, a high contact force can be obtained between the insulating film material and the cooling roller, both before and after the forming of the metal layer. Thus, the thermal deformation of film material can be prevented. The film-running speed and the productivity can be improved. Further, since the electricity removing effect can be improved, the winding or manufacturing or assembling of the film condensers can be smoothed.

BRIEF DESCRIPTION OF THE DRAWINGS

FIG. 2 shows a surface of the material film.

FIG. 5 is a cross sectional view of one example of electricity removing unit 23;

FIG. 7 is a schematic view of a electricity removing unit 23 according to one modification.

Figure 1:
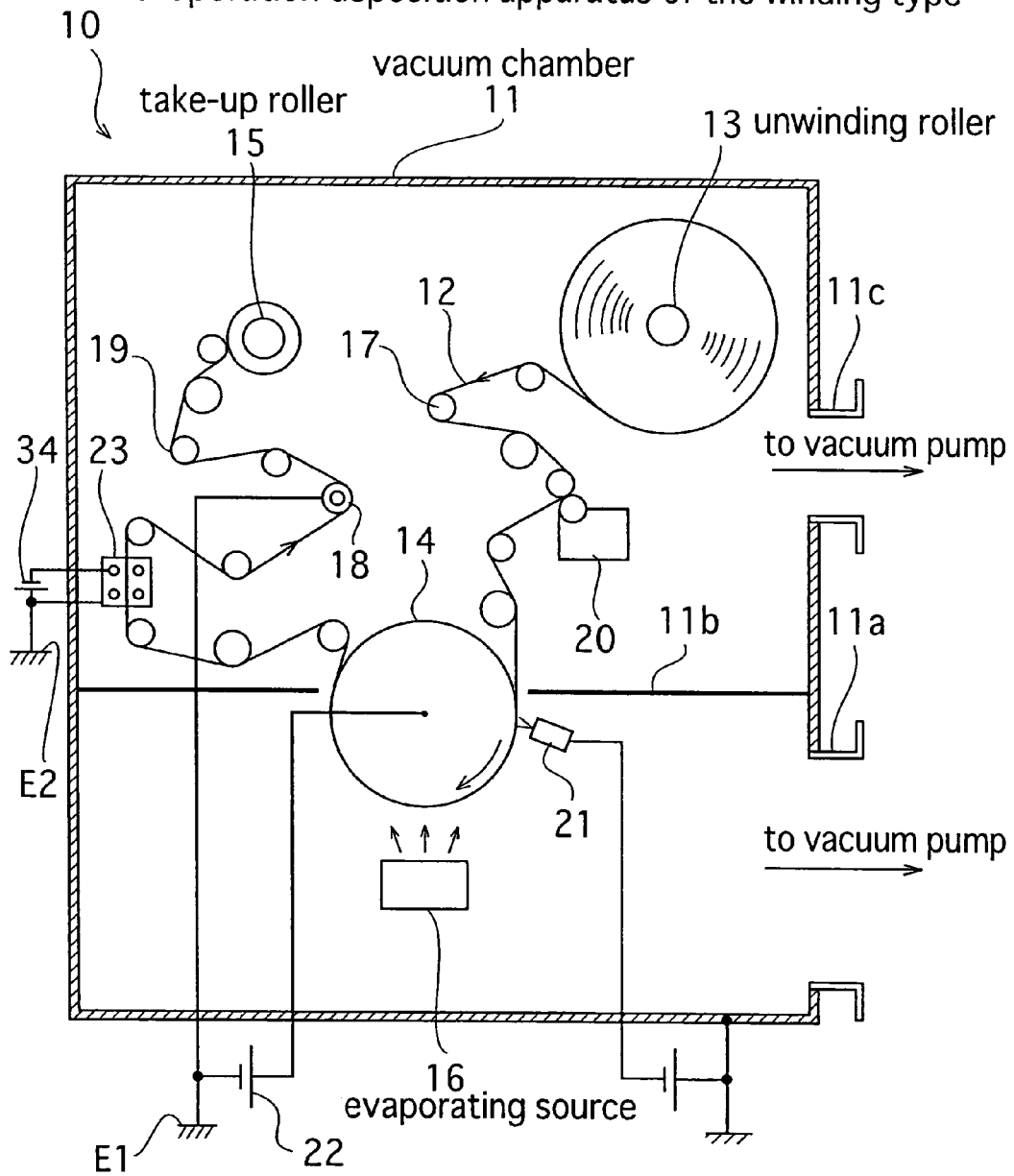
FIG. 1 is a schematic view of a vacuum evaporation deposition apparatus of the winding type 10 according to one embodiment of this invention.

EXPLANATIONS OF LETTERS OR NUMERALS 10 vacuum evaporation deposition apparatus of the winding type (vacuum apparatus of the winding type)
11 vacuum chamber
12 film material
13 unwinding roller
14 can roller (cooling roller)
15 winding roller
16 evaporating source (deposition means)
18 auxiliary roller
20 pattern forming unit (mask-forming means)
21 electron beam irradiator (charged-particle irradiating means)
22 DC bias electric source (voltage supply means)
23 electricity removal means for removing electricity
25 oil pattern
26 metal layer
30 frame (plasma forming chamber)
31A, 31B, 32A, 32B electrode
36 magnet block
E1, E2 ground potential

BEST EMBODIMENT OF INVENTION

Next, an embodiment of this invention will be described with reference to the drawings. A vacuum deposition apparatus of this invention will be applied to a vacuum evaporation deposition apparatus.

FIG. 1 is a schematic view of a vacuum evaporation deposition apparatus 10 of the winding type according to the embodiment of this invention. The vacuum evaporation deposition apparatus of the winding type 10 according to the embodiment is provided with a vacuum chamber 11, an unwinding roller 13 for a film material 12, a cooling can roller 14, a winding roller 15 and an evaporation source (deposition means of this invention) 16 of material to be deposited.

The vacuum chamber 11 is connected through conduit portions 11a and 11c to a vacuum exhaust system including a vacuum pump. The interior of the vacuum chamber 11 is exhausted to a predetermined pressure and it is partitioned into two rooms by a partition wall 11b. The unwinding roller 13 and winding roller 15 are arranged in one of the rooms and the evaporation source 16 is arranged in another of the rooms.

The film material 12 is a long insulating plastic film cut into a predetermined width. OPP (orientating polyplopylen) film is used in this embodiment. PET (polyethylene terephthalate) film, PPS (polyphenylene sulfide) film and a paper sheet can be used.

The film material 12 is fed from the unwinding roller 13 and wound on the winding roller 15 through plural guide rollers 17, a can roller 14, an auxiliary roller 18 and plural guide rollers 19. Although not shown, rotation drives are arranged at the unwinding roller 13 and the winding roller 15, respectively.

The can roller 14 is cylindrical in shape and it is made of metal such as stainless. A cooling mechanism such as a circulating system of cooling water, a rotational drive mechanism for driving can roller 14 and etc, are included in the can roller 14. The film material 12 is wound on the can roller 14 at a predetermined angle range and evaporating material from the evaporation source 16 is deposited on the outside surface of the film material 12, and at the same time, the film material 12 is cooled by the can roller 14.

The evaporation source 16 contains material to be deposited. It is heated by a resistance heater, inductive heater, electron beam or the prior art heating method. A depositing material is heated in the evaporation source 16, which is arranged under the can roller 14. The evaporated material from the source 16 is deposited onto the film material 12 wrapped on the can roller 14.

Metal elements such as Al, Co, Cu, Ni, Ti; and further Al—Zn, Cu—Zn and Fe—Co made of two or more kinds of metal or alloy; may be used as the material to be evaporated. Plural evaporation sources may be arranged instead of one evaporation source.

The vacuum evaporation deposition apparatus 10 of the winding type according to this embodiment is provided further with a pattern forming unit 20, an electron beam irradiator 21, a DC bias source 22 and an electricity-removing unit 23.

The pattern-forming unit 20 forms a region to be deposited with a metal layer on the film material 12. The pattern-forming unit 20 is arranged between the unwinding roller 13 and the can roller 14.

Figure 2A:
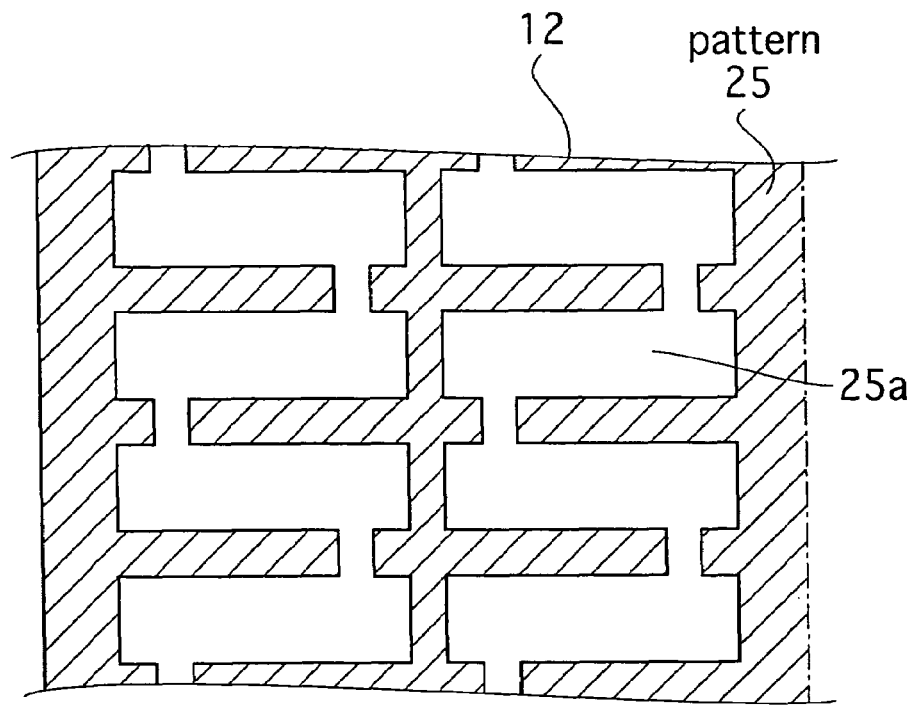
FIG. 2A shows the situation of formed oil pattern 25 and FIG. 2B shows the situation after the deposition of the metal layer 26.
Figure 2B:
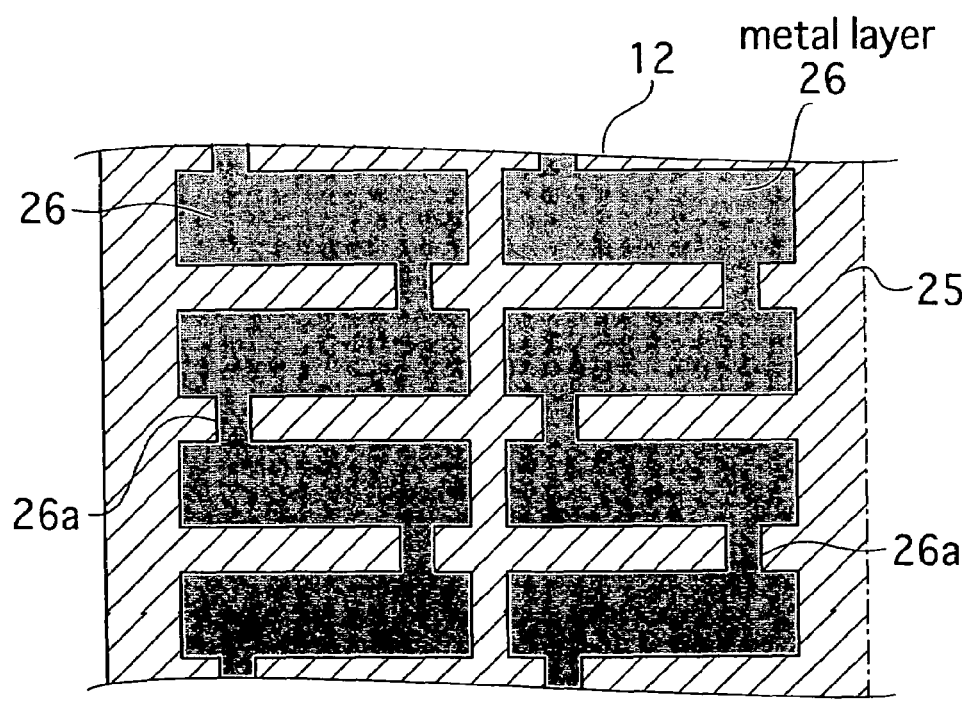

FIG. 2 shows the surface of the material film 12. The pattern-forming unit 20 forms an oil pattern 25 as shown by hatching in FIG. 2A. Plural rows of the oil pattern 25 are formed as coated on the film material 12 along the running direction or lengthwise direction. Rectangular metal patterns 26 are formed by the deposition of the material from the evaporation source 16 in opening portions 25a. They are connected through connecting portions 26a at a predetermined pitch. Thus, the plural rows of metal layer 26 are formed on the film material 12 as shown in FIG. 2B. Of course, the pattern of the deposited metal layer is not limited to the shape as shown on FIG. 2.

Figure 3:
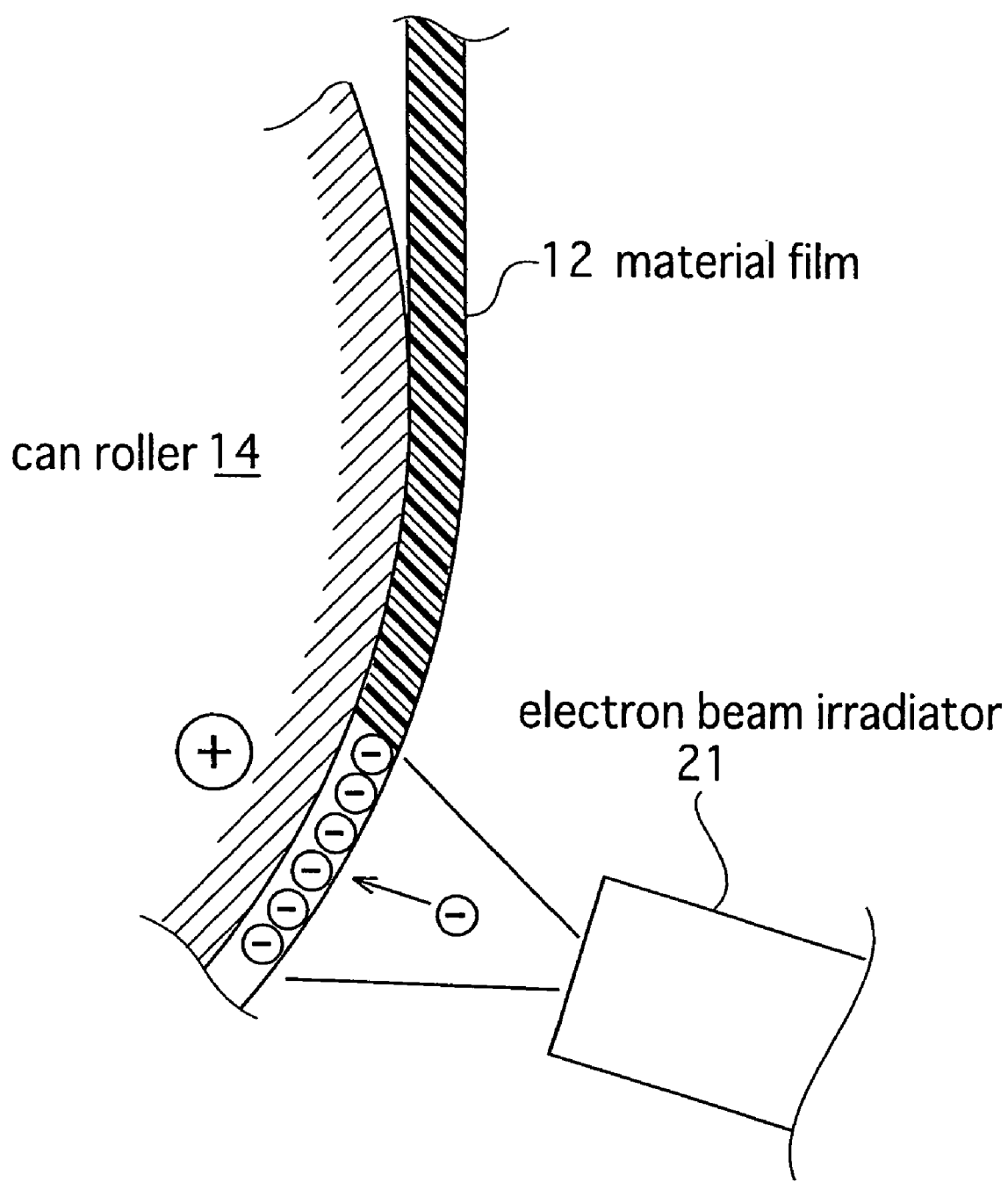
FIG. 3 is a cross-sectional schematic view for explaining an electron beam radiating step for the film material 12.

The electron beam irradiator 21 corresponds to the "charged-particles radiating means" of this invention. Electron beams are irradiated as the charged particles onto the film material 12, and so it is negatively charged. FIG. 3 is a cross-sectional schematic view for explaining the radiating step of the electron beam onto the film material 12. In this embodiment, the electron beam irradiator 21 is arranged at the position of facing to the peripheral surface of the can roller 14. The electron beams are irradiated onto the surface to be deposited, of the film material 12. Since the electron beams are irradiated onto the film material 12 in contact with the can roller 14, the film material 12 being cooled as it receives electron beams.

In this embodiment, the electron beam irradiator 21 scans radiating electron beams on the-film material 12 in the width direction of the film material 12. Thus, the film material 12 is prevented from damage due to local irradiation of electron beams. Thus, the film material 12 can be charged uniformly and effectively.

A predetermined DC voltage is applied between the can roller 14 and the auxiliary roller 18 by the DC bias power source 22, which corresponds to the "voltage applying means" of this invention. In the embodiment, the can roller 14 is connected to a positive electrode of the DC power source 22 and the auxiliary roller 18 is connected to a negative electrode of the DC power source 22. Thus, the film material 12 negatively charged by the radiation of the electron beam is electrostaticly attracted to the surface of the can roller 14 as shown in FIG. 3. Thus, the film material 12 is contacted closely with the can roller 14. The DC power source 22 may be either the constant power type or the variable power type.

The auxiliary roller 18 is made of metal and the peripheral surface of the auxiliary roller 18 contacts rolling on the deposited surface of the material film 12. The auxiliary roller 18 is connected to the earth. (FIG. 1)

Figure 4:
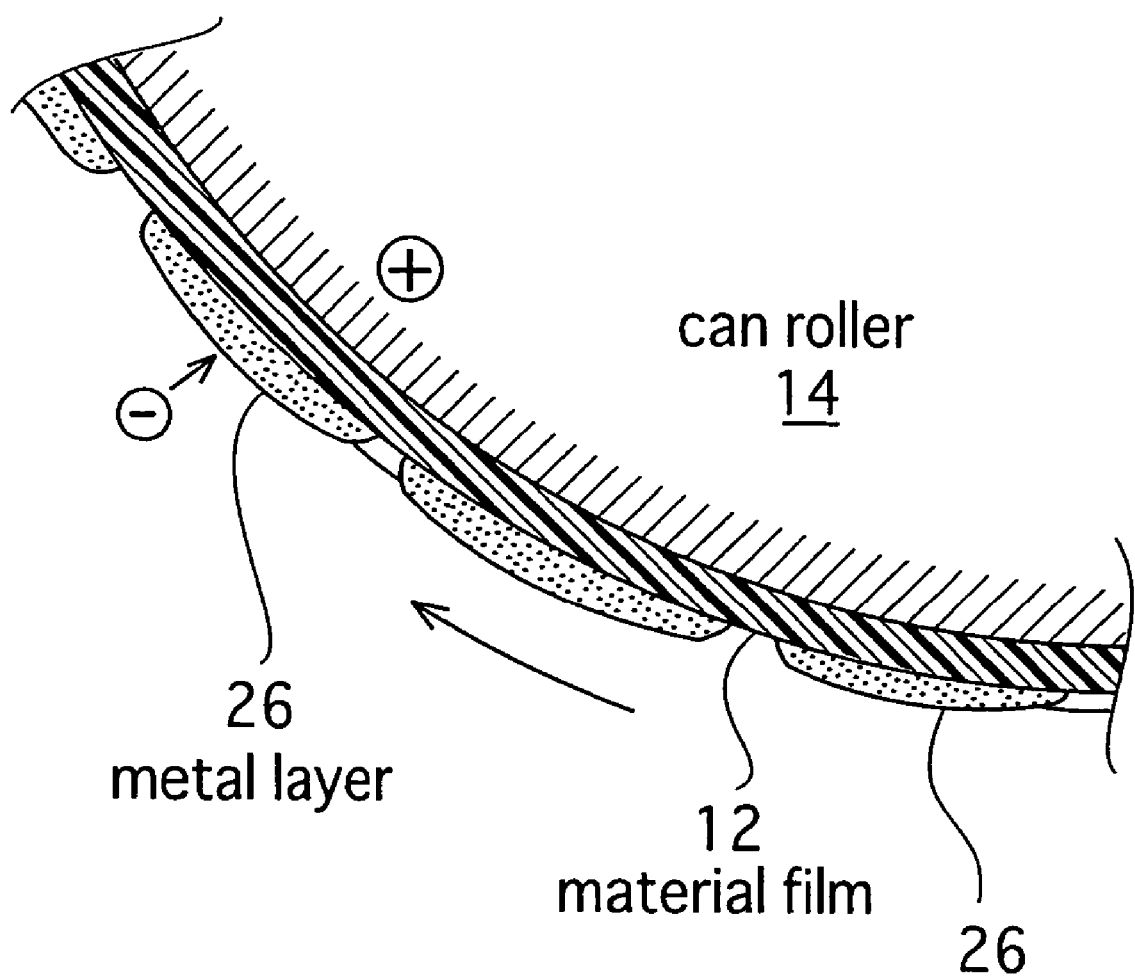
FIG. 4 is a cross-sectional schematic view for explaining the attracting force between the material film 12 and the can roller 14 after the deposition of the metal layer.

FIG. 4 is a cross-sectional schematic view for explaining the attraction between the film material 12 after deposition and the can roller 14. A pattern of the metal layer 26 is formed on the material film 12 by the deposition process. The metal layer 26 is continuous in the longitudinal direction of the film 12 as shown in FIG. 2B. The film material 12 is guided by the auxiliary roller 18 which contacts the metal layer 26. The peripheral surface of the auxiliary roller 18 contacts with the metal layer 26 on the film 12. The can roller 14 is connected to the positive potential of the DC voltage source 22. Negative potential of the DC voltage source 22 is applied to the metal layer 26 in contact with the peripheral surface of the auxiliary roller 18 as shown in FIG. 2B. As a result, the film material 12 interposed between the metal layer 26 and the can roller 14, is polarized. Accordingly an electro-static attractive force occurs between the film material 12 and the can roller 14. Therefore a close contact force is obtained between the can roller 14 and the film material 12.

The electricity-removing unit 23 corresponds to the electricity-removing means of this invention. It is arranged between the can roller 14 and the winding roller 15. It has the function to remove electricity due to the electron beam from the electron beam irradiator 21. One example of the electricity-removing unit 23 is a plasma-bombarded system to remove the electricity charged on the film material 12.

FIG. 5 shows one example of electricity-removing unit 23. FIG. 5A is a cross sectional view taken along the running direction of the film material 12. FIG. 5B is a cross sectional view taken along the direction parallel to the running direction of the film material 12. The electricity removing unit 23 includes a metal frame 30 having slots 30a, 30b which the film material 12 can pass through, two pairs of electrodes 31A, 31B, 32A, 32B which are arranged at the both sides of the film material 12 in the metal frame 30 and a pipe 33 for introducing process gas such as Argon to the inside of the metal frame 30. The frame 30 corresponds to the plasma-forming chamber of this invention.

Figure 6:
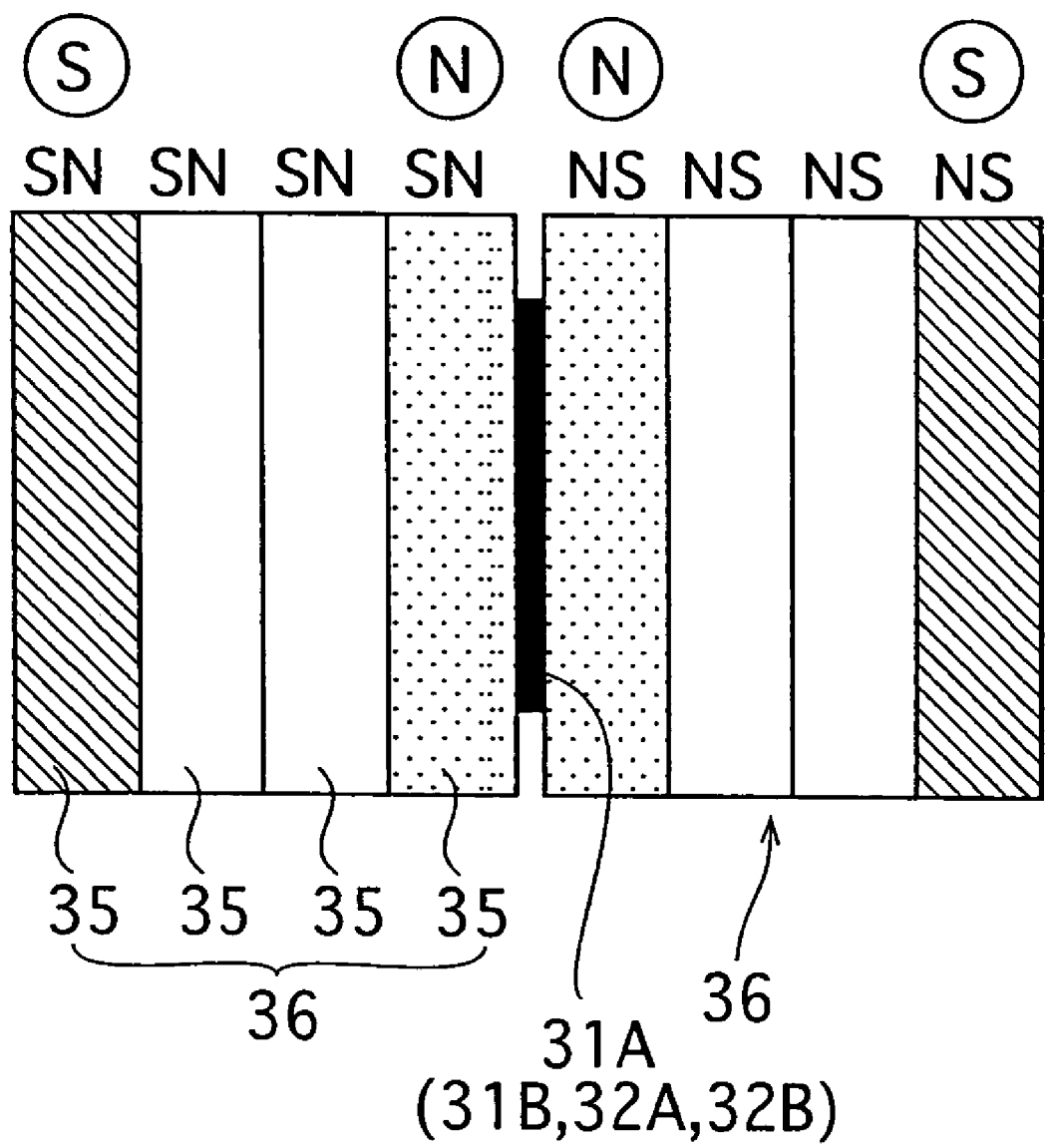
FIG. 6 is an enlarged view of an important part of the internal construction of electricity removing unit 23.
Figure 8:
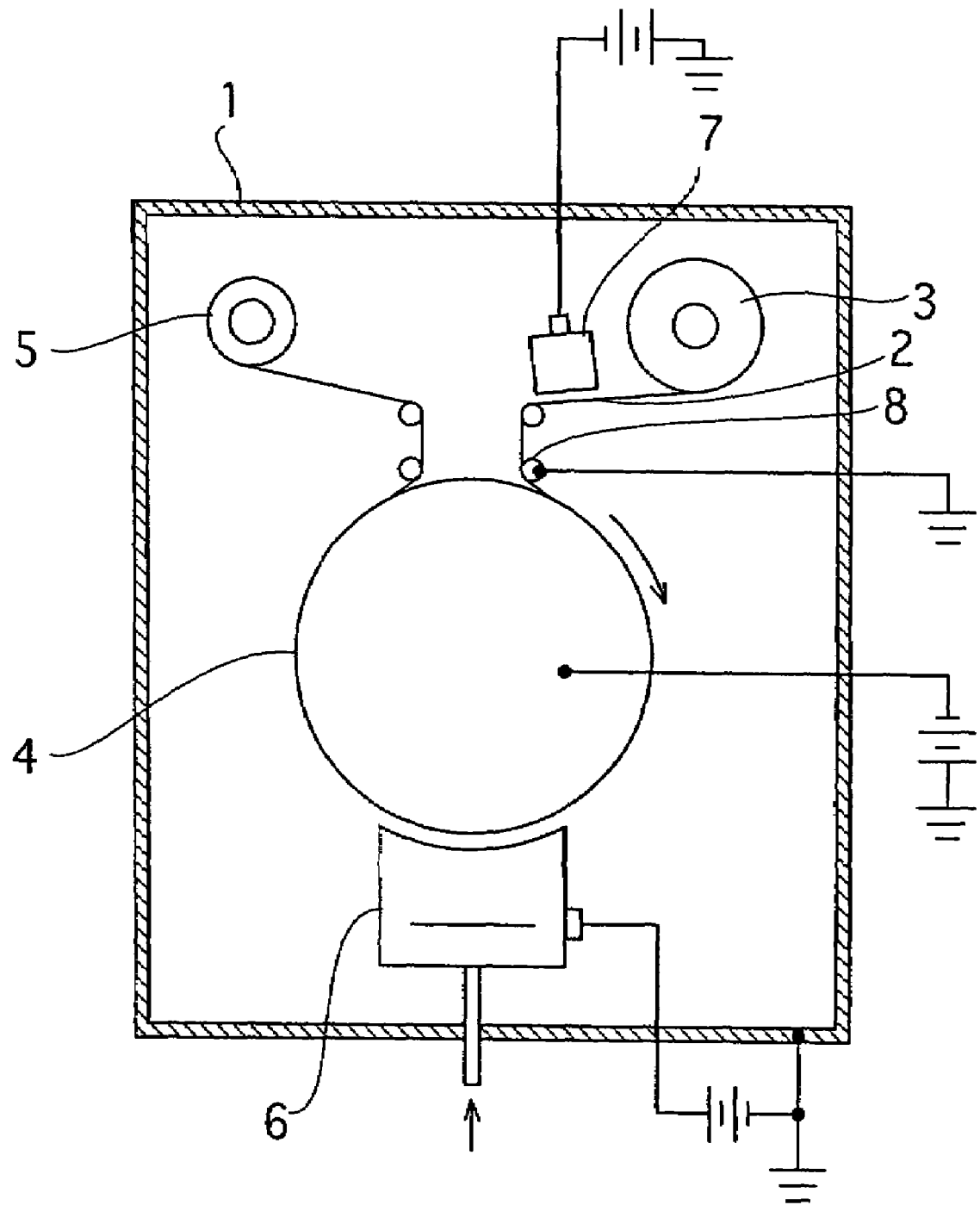
FIG. 8 is a schematic view of a prior art vacuum deposition apparatus of the winding type.

The frame 30 is connected to the positive electrode of the DC voltage source 34 and the ground potential E2. Electrodes 31A, 31B, 32A, 32B are in the shape of a rod or an axis and are connected to the negative electrode of the DC voltage source 34, as shown in FIG. 6. Magnet blocks 36 made of plural ring-like permanent magnet pieces 35 are mounted on the rod-like electrodes 31a, 31b alternatively in inverted polarities as SN-NS-SN.

Since the magnet block 36 consists of plural permanent magnet pieces 35, the distance of between the magnetic blocks 36 can be easily adjusted. Of course, the magnet block 36 may be comprised of a single permanent magnet. The DC voltage source 34 may be a variable power source; not only a constant power source as shown in the Figure.

As above described, the DC voltage is applied between the frame 30 and the electrodes 31A, 31B, 32A, 32B to generate plasma. The electricity-removing unit 23 is the plasma generating source of the DC bipolar discharge type. The electric field between the frame and the electrodes intersects vertically with the magnetic field from the magnet blocks 36. As a result, plasma is generated in the magnetic field around the electrodes by magnet focusing or magnetron discharge.

It is preferable that the plasma is of low pressure to protect the film material 12. The magnetron discharge type can easily generate low-pressure plasma.

Next, the operation of the vacuum evaporation deposition apparatus 10 will be described.

The film material 12 is continuously fed from the unwinding roller 13. It is passing through the oil-pattern forming process, the electron beam radiating process, the evaporation deposition process and the electricity-removing process and is continuously wound by the winding roller 15.

In the mask forming process, the oil pattern 25 is coated on the film material 12, for example, in the shape as shown in FIG. 2A by the pattern-forming unit 20. Such a mask forming method can be employed whereby a transcription roller rolls on the film material 12 to transcribe a necessary pattern thereon.

The film material 12 with the oil pattern is wrapped onto the can roller 14. Near the position of contact start with the can roller 14, the film material 12 is irradiated with the electron beam from the electron beam irradiator 21, and so it is negatively charged. Since the material film 12 is irradiated with the electron beam at the position of contact with can roller 14, and the film material 12 can be effectively cooled by the can roller 14. Further, since the electron beam is irradiated by scanning on the film material in the width direction, the thermal deformation of the film material 12 can be avoided, and further it can be uniformly and effectively charged.

The film material 12 negatively charged by the irradiation of the electron beam is electrostatically attracted and contacted closely with the can roller 14; biased positively by the DC bias voltage source 22, as shown in FIG. 3. The surface of the material film 12 is coated by the material, evaporated from the evaporation source 16. Thus, the metal layer 26 in stripes as shown in FIG. 2B is formed on the film material 12. Plural rows of the stripes are connected through the connecting portions 26a, extended in the lengthwise direction of the film material 12.

The negative potential of the DC bias voltage source 22 is applied through the auxiliary roller 18 to the metal layer 26 formed on the film material 12. After the deposition of the metal layer 26, the one surface of the film material 12 at the side of the metal layer 26 is positively polarized, and the other surface of the film material 12 at the side of the can roller 14 is negatively polarized. Thus, an electrostatic attractive force occurs between the film material 12 and the can roller 14. As a result, the film material 12 is closely contacted with the can roller 14.

As above described, in this embodiment, the film material 12 is charged with the irradiation of the electron beam before the deposition process of the metal layer 26, to be closely contacted with the can roller 14. After the deposition process of the metal layer 26, the film material 12 is closely contacted with the can roller 14 with the bias voltage applied between the metal layer 26 and the can roller 14. Although a part of charges (electrons) on the film material 12 charged before the deposition process of the metal layer 26 is discharged and dissipated into the metal layer during the deposition process, all or a part of the dissipated charges are compensated with the application (supply of the electrons) of the negative potential to the metal layer 26 from the auxiliary roller 18.

According to the embodiment of this invention, the decrease of the contact force between the film material 12 and the can roller 14 is suppressed also after the deposition process, and so the stable cooling operation of the film material 12 can be secured both before the deposition process and after deposition process.

Thus, the thermal deformation of the film material 12 can be avoided during the deposition process of the metal layer. The running speed of the film material 12 and the metal film forming speed can be improved. Thus, the productivity can be improved. This embodiment is particularly useful for the film material 12 made of material which is hard to be charged, with the metal layer deposited, such as OPP film. When the metal layer 26 is pattern-likely formed on the material film 12 as in this embodiment, the temperature is locally raised, and the amount of the charges sometimes varies. The discharged metal deposition portion is compensated with the bias voltage and so the contact force between the material film and the can roller can be strengthened. That is advantages, because the film material 12 is uniformly cooled.

As above described, the metal layer is deposited on the film material 12 and the electricity is removed by the electricity removing unit 23. Thereafter the film material is wound by the winding roller 15. In this embodiment, the electricity-removing unit 23 is comprised of the plasma-generating source of the DC dipole discharge type, of which the one of electrodes is connected to earth. Accordingly the potential of the electrodes 31A, 31B, 32A, 32B can be easily and accurately controlled on the ground standard of the frame 30 and the electricity removing effect can be improved.

When the electricity-removing unit 23 is not connected to ground, the unit is electrically floated and the standard potential varies and the electricity removing effect is low. On the other hand, in this embodiment, the one electrode of the electricity-removing unit 23 (frame 30) is connected to the standard potential E2. The electricity removing of a few volts to a few tens of volts can be obtained with the adjustment of the DC voltage 32. Accordingly, the charged voltage of the film can be reduced to a few volts. The film can be stably wound up and film wrinkle can be prevented. The manufacture and assembly of the layered film condenser can be proper.

Further since the auxiliary roller 18 also is connected to the earth, before the introduction to the electricity removing unit 23, electricity is in advance removed from the film material 12, and therefore the electricity removing effect can be further improved.

While the preferred embodiments of the Invention have been described, without being limited to this embodiment, variations thereto will occur to those skilled in the art within the scope of the present inventive concepts that are delineated by the following claims.

For example, in the above embodiment, the metal layer 26 is deposited on the insulating film material 12 in the shape of stripes connected through the connecting portions 26a as shown in FIG. 2B. The pattern is not limited to the shown type. For example, linear patterns along the lengthwise direction of the insulating material film can be employed within the scope of this invention, or a metal layer may be formed as a single layer and a uniform pattern-less shape on the insulating material film 12.

Further, in the above embodiment, the electron beams are irradiated on the insulating film material 12 to negatively charge the film. Instead of the electron beam, ions may be irradiated on the insulating film material 12 to positively charge it. In this case, polarities applied between the can roller 14 and the auxiliary roller 18 are inverted from the above embodiment. Thus, the can roller 14 is connected to the negative electrode and the auxiliary roller 18 is connected to the positive electrode.

In the above embodiment, the two pairs of the rod like electrodes 31A, 31B, 32A 32B are arranged at both of the sides of the film material 12. Instead one pair of the electrodes 31A and 31B may be arranged at both of the sides of the film material 12 as shown in FIG. 7. Moreover, the electrodes of the electricity removing unit 23 may be connected to earth, and instead the frame is connected to earth. Further the electricity-removing unit 23 may be arranged on the downstream side of the auxiliary roller 18.

In the above embodiment, the evaporation deposition method is applied for the metal layer forming method. Of course, any other method such as a sputtering method and various CVD methods may be employed.

The invention claimed is:

1. A vacuum deposition apparatus of the winding type including:
   a vacuum chamber,
   an unwinding roller for continuously feeding an insulating film material, arranged in said vacuum chamber,
   a winding roller for taking up said insulating film material,
   a cooling roller for contact cooling said insulating film material arranged between said unwinding roller and said winding roller, and
   deposition means for forming a metal layer on said insulating film material arranged facing to said cooling roller,
   characterized in that said apparatus is further comprised of:
   an auxiliary roller for guiding said insulating film material in contact with the deposited metal layer and arranged between said winding roller and said cooling roller;

voltage-applying means connected for applying a DC voltage between said auxiliary roller and said cooling roller; and electricity removing means connected for removing electricity from the film material while said film material runs in a plasma, and arranged between said cooling roller and said winding roller;

said auxiliary roller being connected to ground;

said cooling roller being connected to said voltage-applying means; and said electricity removing means being comprised of a plasma-forming chamber arranged in said vacuum chamber, said plasma-forming chamber including a slot configured to introduce said film material into said plasma-forming chamber, said plasma-forming chamber being connected to ground, and an electrode unit arranged in said plasma-forming chamber and connected to a discharge voltage source, said electricity removing means being a plasma generating source for generating said plasma in said plasma-forming chamber.

2. A vacuum deposition apparatus of the winding type according to claim 1, in which said electrode unit includes at least one pair of electrodes at the same potential, and said film material runs between said at least one pair of electrodes.

3. A vacuum deposition apparatus of the winding type according to claim 2, in which said electrodes are rod-like and permanent magnets are mounted on the outer periphery thereof.

4. A vacuum deposition apparatus of the winding type according to claim 1, in which a charged particles irradiating means for irradiating charge particles onto said film material is arranged between said unwinding roller and said deposition means.

5. A vacuum deposition apparatus of the winding type according to claim 1, further comprised of a gas introducing means for introducing a gas into said plasma-forming chamber, said gas introducing means being arranged in said plasma-forming chamber.

* * * * *